United States Patent
Zeng et al.

(10) Patent No.: US 8,638,127 B2
(45) Date of Patent: Jan. 28, 2014

(54) TEMPERATURE-INDEPENDENT UNDERVOLTAGE DETECTOR AND RELATED METHOD

(75) Inventors: Ni Zeng, Shenzhen (CN); Da Song Lin, Shenzhen (CN)

(73) Assignee: STMicroelectronics (Shenzhen) R&D Co., Ltd, Shenzhen (CN)

( * ) Notice: Subject to any disclaimer, the term of this patent is extended or adjusted under 35 U.S.C. 154(b) by 131 days.

(21) Appl. No.: 12/955,644

(22) Filed: Nov. 29, 2010

(65) Prior Publication Data

US 2011/0148471 A1    Jun. 23, 2011

(30) Foreign Application Priority Data

Dec. 21, 2009   (CN) .......................... 2009 1 0258780

(51) Int. Cl.
*H03K 5/153* (2006.01)
(52) U.S. Cl.
USPC .................. 327/77; 327/83; 327/513; 327/65
(58) Field of Classification Search
USPC ..................... 327/77, 512–513, 65, 66, 83, 89
See application file for complete search history.

(56) References Cited

U.S. PATENT DOCUMENTS

| 6,184,728 B1 * | 2/2001 | Ohki ............................. 327/108 |
| 7,109,761 B2 * | 9/2006 | Isomura .......................... 327/77 |
| 2005/0168265 A1 * | 8/2005 | Lee et al. ....................... 327/536 |
| 2007/0070720 A1 * | 3/2007 | Lee et al. ................. 365/189.09 |
| 2007/0070722 A1 * | 3/2007 | Park et al. ................ 365/189.09 |

OTHER PUBLICATIONS

"Most power management device (PMD)," STMicroelectronics L5961, Jan. 2008, Rev 1, pp. 1-7.
"STMicroelectronics Announces Integrated Power-Management Chip for Multimedia Networking in Cars," STMicroelectronics, Geneva, Mar. 7, 2008, 2 pages.
"Most Recent, SMSC's Automotive Newsletter," SMSC Europe GmbH, Jul. 2007, pp. 1-10.

* cited by examiner

*Primary Examiner* — Quan Tra
(74) *Attorney, Agent, or Firm* — Slater & Matsil, L.L.P.

(57) ABSTRACT

Embodiments related to an undervoltage detector are described and depicted. An undervoltage detector is formed to detect a low input bias voltage with a voltage divider network including first and second series circuits of semiconductor devices coupled to terminals of the input bias voltage source, and a resistor voltage divider including first and second voltage divider resistors coupled in series with the first and second series circuits. A ratio representing the numbers of semiconductor devices in the series circuits is substantially equal to a ratio of resistances in the resistor voltage divider. The equality of the ratios may be corrected by the presence of other resistances in the undervoltage detector. The semiconductor devices are each coupled in a diode configuration. The first series circuit is coupled to a current mirror to provide a bias current for a comparator that produces an output signal for the undervoltage detector.

17 Claims, 1 Drawing Sheet

TEMPERATURE-INDEPENDENT UNDERVOLTAGE DETECTOR AND RELATED METHOD

CROSS-REFERENCE TO RELATED APPLICATION

This Application claims the priority benefit of People's Republic of China Patent Application Serial No. 200910258780.9, filed Dec. 21, 2009 and entitled "Temperature-Independent Undervoltage Detector and Related Method," which is hereby incorporated by reference to the maximum extent allowable by law.

TECHNICAL FIELD

This disclosure relates generally to design of an integrated circuit, and particularly to controlling a start-up voltage for an integrated circuit and a related method.

BACKGROUND

An integrated circuit is generally operable over a range of an input bias voltage, such as over a range of a maximum rated and a minimum rated input bias voltage. Circuitry on the integrated circuit such as a control chip for a power converter will not operate reliably at an input bias voltage lower than the minimum rated voltage, and the circuitry can be irreversibly damaged at an input bias voltage higher than the maximum rated voltage. As a protective feature, an undervoltage detector is usually included in the design of the integrated circuit to generate a start current for the chip and to set a lowest working input bias voltage threshold for the chip. If the input bias voltage is less than the threshold, operation of the chip is disabled.

The input bias voltage supplied to an integrated circuit is generally sensed by an undervoltage detector employing a resistor-divider network coupled in series with a number of transistors, each transistor connected in a diode configuration by coupling its base to its collector or its gate to its drain. Temperature- and process-dependent voltage drops across diodes generally exhibit a different variation from corresponding voltage drops across resistors, particularly resistors formed on the integrated circuit as semiconductor elements. The different behaviors of these voltage drops produce a variable temperature- and process-dependent threshold voltage in a comparator employed to detect a lower limit for the input bias voltage. The variability in the threshold voltage generally requires accommodation in the design of the undervoltage detector that limits a lower operational voltage range for the integrated circuit.

Turning now to FIG. 1, illustrated is a schematic drawing of a conventional undervoltage detector for an integrated circuit that may be employed to set a lowest working input bias voltage threshold for the integrated circuit. If an input bias voltage is less than the threshold, operation of the integrated circuit is disabled, and the integrated circuit is maintained in a standby state. If the input bias voltage is greater than the threshold, normal operation of the integrated circuit is enabled.

The input bias voltage $V_{BAT}$ is sensed by an undervoltage detector employing a resistor-divider network. A scaled value V1 of the input bias voltage $V_{BAT}$ produced at the junction of resistors R1 and R2 is sensed by a comparator formed with transistors M1 and M2 coupled to a current mirror formed by transistors M3 and M4. A reference voltage $V_{BG}$ is supplied to the comparator by a bandgap reference, such as a 1.25 V bandgap reference. The design of current mirrors is well known in the art, and will not be further described in the interest of brevity. The output signal 103 of the comparator is inverted by transistor M7, which is then sensed by inverter INV1 and inverted again by inverter INV2 to produce an undervoltage detector output signal UPM1 dependent on a chip turn-on threshold voltage.

Providing a wide operational voltage range for an integrated circuit is often a key success factor for such devices in the marketplace. The design of an improved arrangement for an integrated circuit to detect an input bias voltage below an undervoltage limit would address an unresolved application need.

SUMMARY

In accordance with one embodiment, an undervoltage detector is configured to detect a low input voltage to a semiconductor device wherein the voltage detection is substantially independent of an operating temperature thereof or the semiconductor processes with which semiconductor components of the undervoltage detector are formed. In an embodiment, a voltage divider network is formed with a ratio representing numbers of semiconductor devices equal to a ratio of resistances of the resistors in a resistor voltage divider. In a further embodiment, the equality of the ratios is corrected by the presence of other resistances in the undervoltage detector. In an embodiment, the undervoltage detector is formed with the voltage divider network including a first series circuit arrangement of a number M of at least one semiconductor device coupled to a first terminal of an input bias voltage source, and a second series circuit arrangement of a first voltage divider resistor and a second voltage divider resistor coupled in series with the first series circuit arrangement. A circuit node is formed between the first and the second voltage divider resistors. A third series circuit arrangement is coupled in series with the second series circuit arrangement. The third series circuit arrangement includes a number P of at least one semiconductor device coupled to a second terminal of the input bias voltage source. A comparator is formed with one input coupled to the circuit node formed between the two voltage divider resistors, and another input coupled to a voltage reference.

The P and the M semiconductor devices are each coupled in a diode configuration.

The first series circuit arrangement can be configured to provide a bias current for the comparator.

A first biasing resistor is coupled to a current input terminal of a first comparator input transistor, and a second biasing resistor is coupled to a current input terminal of a second comparator input transistor.

A current mirror with an input can be coupled to the first series circuit arrangement to provide the bias current for the comparator.

In one embodiment, a resistance of the first biasing resistor is equal to a resistance of the second biasing resistor, and a ratio of the number P to the number M is equal to a ratio of a resistance of the second voltage divider resistor to a resistance of the first voltage divider resistor.

BRIEF DESCRIPTION OF THE DRAWINGS

The details of one or more embodiments of the disclosure are set forth in the accompanying drawings and the description below. In the figures, identical reference symbols generally designate the same component parts throughout the various views, and may be described only once in the interest of brevity. For a more complete understanding of the disclosure, reference is now made to the following descriptions taken in conjunction with the accompanying drawings, in which.

DETAILED DESCRIPTION OF ILLUSTRATIVE EMBODIMENTS

The specific embodiments discussed herein are merely illustrative, and do not limit the scope of the invention.

Figure 2:
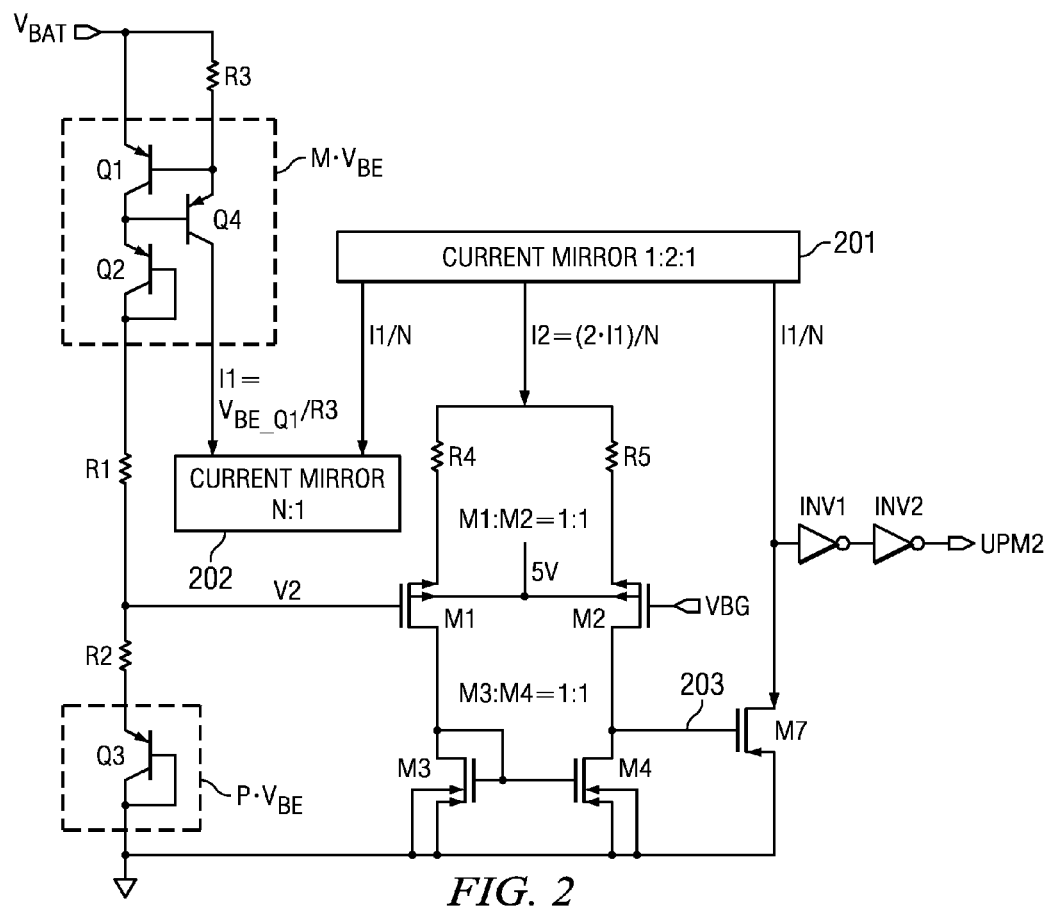
FIG. 2 illustrates a schematic drawing of an undervoltage detector for an integrated circuit, constructed according to an embodiment.

Turning now to FIG. 2, illustrated is a schematic drawing of an undervoltage detector for an integrated circuit, constructed according to an embodiment. The undervoltage detector is capable of operating with a very low quiescent current, which is becoming a requirement in new circuit designs. Another new requirement is a lower operational threshold voltage for the input bias voltage, which requires a greater level of precision in detecting the input bias voltage. Designs of integrated circuits for a controller for a power converter were previously required to operate down to an input voltage of 7 V. Recent designs now require operation down to 4 V, which stresses many elements of the circuit design. Accordingly, a new design is required to operate with smaller margins.

The undervoltage detector senses the input bias voltage $V_{BAT}$ by employing a resistor-divider network including resistors R1 and R2 coupled in series with a number of M npn bipolar transistors Q1, Q2, and Q4. As illustrated in the example circuit in FIG. 2, M=3, but a larger number for M can be selected, for example, by replicating the bipolar transistor Q2 that is coupled in a diode configuration in series with the resistor R1. A diode configuration of the bipolar transistor Q2 is produced by the base-to-collector short illustrated in FIG. 2. The input bias voltage $V_{BAT}$ coupled through npn bipolar transistor Q1 to the emitter of transistor Q4 is reduced by a diode forward voltage drop produced by the emitter-base junction of transistor Q1. Resistor R3 is coupled between the emitter and base of transistor Q1. As the input bias voltage $V_{BAT}$ increases from zero, current initially flows through resistor R3 until the voltage across the resistor R3 becomes within about a diode forward voltage drop of the base-emitter voltage of transistor Q1. When the voltage across the resistor R3 becomes within about a diode forward voltage drop of the base-emitter voltage of transistor Q1, current begins to flow through the "base-emitter diode" of transistor Q1, enabling transistor Q1 to conduct. Thus, as the input bias voltage $V_{BAT}$ increases from zero, the transistor Q4 initially conducts only a small current. As the input voltage $V_{BAT}$ increases further, the collector of transistor Q4 conducts the current $I1=(V_{BE\_Q1})/R3$ which is fed to current mirror 202. Thus, the input battery voltage $V_{BAT}$ is coupled to the resistor-divider network formed with resistors R1 and R2 through three diode voltage drops.

A further diode voltage drop may be produced by npn bipolar transistor Q3 which is coupled in series with the resistor-divider network formed with upper and lower voltage divider resistors R1 and R2. Transistor Q3 produces a diode voltage drop by the base-to-collector short illustrated in FIG. 2. In general, P bipolar transistors coupled in a diode circuit configuration may be coupled in series with the resistor R2. In the example circuit illustrated in FIG. 2, P=1 because only one bipolar transistor Q3 is coupled in series with the resistor R2.

A scaled value of the input bias voltage $V_{BAT}$, i.e., the voltage V2, that is produced at the junction of resistors R1 and R2 is sensed by a comparator formed with p-channel field-effect transistors M1 and M2 coupled to a current mirror formed by n-channel field-effect transistors M3 and M4. In an alternative embodiment, bipolar transistors may be substituted here and elsewhere for field-effect transistors in the undervoltage detector, with necessary circuit accommodations known to one with ordinary skill in the art. Biasing resistors R4 and R5 are coupled, respectively, in series with the sources of field-effect transistors M1 and M2. The substrates of field-effect transistors M3 and M4 are coupled to an internal 5 V bias voltage source or other internal voltage level. A reference voltage $V_{BG}$ is supplied to the comparator by a bandgap reference, such as a 1.25 V bandgap reference. The sources of field-effect transistors M1 and M2 are fed a current $I2=2 \cdot I1/N$ by current mirror 201 that is supplied a reference current I1/N by N:1 current mirror 202 that, in turn, is supplied by the current I1. The output signal 203 of the comparator is inverted by n-channel field-effect transistor M7, which is sensed by inverter INV1 and then inverted again by inverter INV2 to produce an undervoltage detector output signal UPM2 to provide a chip turn-on threshold voltage $V_{BAT\_threshold}$. The inverters INV1 and INV2 are optional circuit elements that may be included in an undervoltage detector design to provide particular logical output signals.

In FIG. 2, the voltage V2 and the current I2 are related by the following equations:

$$V2 = P \cdot V_{BE} + \frac{V_{BAT} - (P+M) \cdot V_{BE}}{R_1 + R_2} \cdot R_2,$$

$$I2 = \frac{2}{N} \cdot \frac{V_{BE}}{R_3},$$

where $V_{BE}$ again represents a base-emitter voltage. The parameters P and M were described previously hereinabove. Resistor symbols such as the symbols "R1" and "R2" are employed herein to represent resistors in figures as well as their respective resistance values in equations.

At the transition/switching point of the comparator (formed with field-effect transistors M1, M2, etc.), the gate-to-source threshold voltage $V_{Gs(M1)}$ of transistor M1 is equal to the gate-to-source threshold voltage $V_{GS(M2)}$ of transistor M2, i.e., $$V_{GS(M1)} = V_{GS(M2)}.$$

Accordingly, at the transition/switching point of the comparator, $$V2 + \frac{I2}{2} \cdot R4 = V_{BG} + \frac{I2}{2} \cdot R5.$$

The threshold voltage of the comparator $V_{BAT\_threshold}$ is given by the equation:

$$V_{BAT\_threshold} = V_{BG} \cdot \frac{R1+R2}{R2} - \left[ \frac{P \cdot R1 - M \cdot R2}{R1+R2} + (R4-R5) \cdot \frac{1}{N \cdot R3} \right] \cdot V_{BE} \cdot \frac{R1+R2}{R2}$$

From the equation above, if Equation (1) below is satisfied:

$$\left[\frac{P \cdot R1 - M \cdot R2}{R1 + R2} + (R4 - R5) \cdot \frac{1}{N \cdot R3}\right] = 0, \quad (1)$$

then Equation (2) below indicates that $V_{BAT\_threshold}$ is substantially only dependent on the voltage $V_{BG}$ produced by the bandgap reference and a resistor ratio:

$$V_{BAT\_threshold} = V_{BG} \cdot \frac{R1 + R2}{R2}. \quad (2)$$

If the resistors R4 and R5 have equal resistance, then equation (1) is satisfied if $$P \cdot R1 = M \cdot R2, \quad (3)$$

i.e., the ratio of the number P to the number M is equal to the ratio of the resistance of the lower voltage divider resistor R2 to the upper voltage divider resistor R1. Equations (2) above illustrates that a threshold voltage $V_{BAT\_threshold}$ for the comparator formed with field-effect transistors M1, M2 is substantially independent of diode and a base-emitter forward voltage drops, and is therefore substantially independent of the operating temperature of the comparator and the process for forming devices therein. Equation (3) illustrates a simpler relationship when the biasing resistors R4 and R5 have equal resistance. The threshold voltage is dependent on a ratio of resistors, R1/R2, which may be substantially constant even if a semiconductor manufacturing process to produce them produces individual resistors with a temperature- or process-dependent resistance. Thus, an undervoltage detector is formed with an advantageous temperature- and process-independent characteristic.

In one embodiment, values for components illustrated in FIG. 2 are:
N=8,
R1=13.7 MΩ,
R2=5.3 MΩ,
M=3,
P=1,
R3=950 kΩ.
R4=500 kΩ, and
R5=500 kΩ.

The resistance of resistor R3 may be adjusted for a particular bias current of the N:1 current mirror 202 to provide a suitable input current level for the comparator by current mirror 201. One skilled in the art will recognize that the value provided herein are merely by way of example and that numerous variations are within the scope of the present invention. Although a ratio of M to P of 3:1 is disclosed, this ratio could be 10:1, 1:1, 1:3 or any other ratio, depending upon the desired performance characteristics of the resulting circuit.

Figure 1:
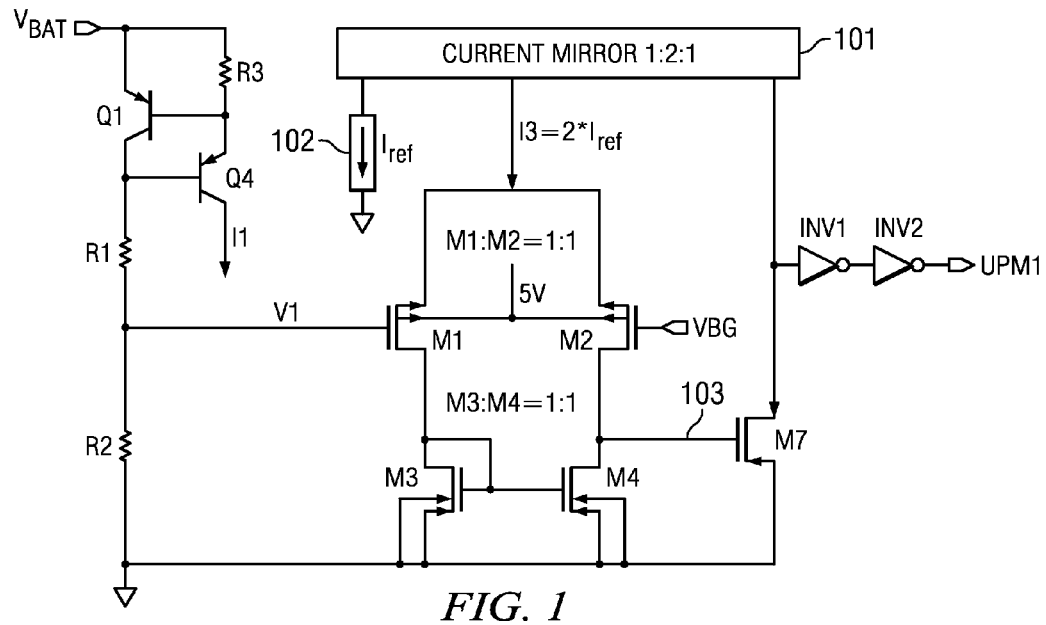
FIG. 1 illustrates a schematic drawing of a conventional undervoltage detector for an integrated circuit.

Simulation results for typical/minimal/maximal process variations of the detectors illustrated and described with reference to FIGS. 1 and 2 are listed below in TABLE I, demonstrating that the new detector has a better temperature characteristic than a conventional detector.

TABLE I

| Temperature, °C. | Process Bias | New Detector (V) | Conventional Detector (V) |
|---|---|---|---|
| −40 | typical | 4.51 | 4.85 |
| 27 | typical | 4.51 | 4.53 |
| 125 | typical | 4.48 | 4.02 |

TABLE I-continued

| Temperature, °C. | Process Bias | New Detector (V) | Conventional Detector (V) |
|---|---|---|---|
| −40 | minimum | 4.60 | 4.86 |
| 27 | minimum | 4.52 | 4.55 |
| 125 | minimum | 4.49 | 4.06 |
| −40 | maximum | 4.52 | 4.84 |
| 27 | maximum | 4.52 | 4.51 |
| 125 | maximum | 4.48 | 3.99 |

Thus, an undervoltage detector has been described whose operation is advantageously substantially independent of an operating temperature thereof or the semiconductor processes with which semiconductor components of the undervoltage detector are formed. The undervoltage detector may be used to disable operation of an integrated circuit at a low input bias voltage.

The concept has been introduced of forming the undervoltage detector with a voltage divider network including a number of semiconductor devices coupled in a diode configuration in series with a resistor voltage divider. In an embodiment, the voltage divider network is formed with a ratio of the number of semiconductor devices coupled in a diode configuration equal to a ratio of resistances of the resistors in the resistor voltage divider. In an embodiment, the ratio of the number of semiconductor devices coupled in series with a lower portion of the resistor voltage divider to the number of semiconductor devices coupled in series with an upper portion of the resistor voltage divider is equal to the ratio of the resistance of the lower portion of the voltage divider resistor to the resistance of the upper portion of the voltage divider. In a further embodiment, the ratio of the number of semiconductor devices coupled in a diode configuration is corrected by the presence of other resistances in the undervoltage detector.

In an embodiment, the voltage divider network includes a first series circuit arrangement of a number M of at least one semiconductor device coupled to a first terminal of the input bias voltage source. A second series circuit arrangement of a resistor voltage divider includes a first voltage divider resistor and a second voltage divider resistor. The second series circuit arrangement is coupled in series with the first series circuit arrangement. A circuit node is formed between the first and the second voltage divider resistors. A third series circuit arrangement is coupled in series with the second series circuit arrangement. The third series circuit arrangement includes a number P of at least one semiconductor device coupled to a second terminal of the input bias voltage source. A comparator is formed with one input coupled to the circuit node formed between the two voltage divider resistors, and another input coupled to a voltage reference. In an embodiment, a ratio of the number P to the number M is equal to a ratio of a resistance of the second voltage divider resistor to a resistance of the first voltage divider resistor.

In an embodiment, the first series circuit arrangement is configured to provide a bias current for the comparator.

In an embodiment, a first biasing resistor is coupled to a current input terminal of a first comparator input transistor, and a second biasing resistor is coupled to a current input terminal of a second comparator input transistor.

In an embodiment, the first comparator input transistor is a metal oxide semiconductor field-effect transistor, and the current input terminal of the first comparator input transistor is a source input terminal of the first comparator input transistor. The second comparator input transistor is a metal oxide semiconductor field-effect transistor, and the current input terminal of the second comparator input transistor is a source input terminal of the second comparator input transistor.

In an embodiment, the P semiconductor devices and the M semiconductor devices are each coupled in a diode configuration.

In an embodiment, a current mirror with an input is coupled to the first series circuit arrangement to produce the bias current.

In an embodiment, a resistance of the first biasing resistor is equal to a resistance of the second biasing resistors, and a ratio of the number P to the number M is equal to a ratio of a resistance of the second voltage divider resistor to a resistance of the first voltage divider resistor.

In an embodiment, a collector-base resistor with a resistance R3 is coupled between an emitter and a base of one of the number M of at least one semiconductor device. The bias current provided by the first series circuit arrangement for the comparator is coupled to the comparator by a current mirror that reduces the bias current by a factor N, and the relationship:

$$\left[ \frac{P \cdot R1 - M \cdot R2}{R1 + R2} + (R4 - R5) \cdot \frac{1}{N \cdot R3} \right] = 0$$

is substantially satisfied wherein R1 and R2 represent, respectively, resistances of the first and the second voltage divider resistors, and R4 and R5 represent, respectively, resistances of the first and the second biasing resistors.

In an embodiment, an output of the comparator is employed to produce an undervoltage detection signal. In a further embodiment, a first inverter is coupled to the output of the comparator to produce the undervoltage detection signal. In a further embodiment, a second inverter is coupled to the output of the first inverter to produce the undervoltage detection signal.

Another embodiment provides a method of forming an undervoltage detector. In an embodiment, the method includes forming a voltage divider network including coupling a first series circuit arrangement of a number M of at least one semiconductor device to a first terminal of an input bias voltage source, coupling a second series circuit arrangement of a first voltage divider resistor and a second voltage divider resistor in series with the first series circuit arrangement, wherein a circuit node is formed between the first and the second voltage divider resistors. The first voltage divider resistor and the second voltage divider resistor form a resistor voltage divider. The method further includes coupling a third series circuit arrangement of a number P of at least one semiconductor device to a second terminal of the input bias voltage source, wherein the third series circuit arrangement is coupled in series with the second series circuit arrangement. The method further includes forming a comparator, including coupling one input to the circuit node formed between the two voltage divider resistors, coupling another input to a voltage reference, and employing the first series circuit arrangement to provide a bias current for the comparator.

In an embodiment, the P semiconductor devices and the M semiconductor devices are each coupled in a diode configuration.

In a further embodiment, the method includes coupling a first biasing resistor to a source terminal of a first comparator input transistor, and coupling a second biasing resistor to a source terminal of a second comparator input transistor.

In a further embodiment, the method includes forming the divider network with a ratio of the number P to the number M equal to a ratio of a resistance of the second voltage divider resistor to a resistance of the first voltage divider resistor.

In an embodiment the method includes coupling a first biasing resistor to a source terminal of a first comparator input transistor, coupling a second biasing resistor to a source terminal of a second comparator input transistor, and selecting the first biasing resistor to have a resistance equal to a resistance of the second biasing resistor.

In a further embodiment, the method includes providing the bias current employing a current mirror, and coupling an input of the current mirror to the first series circuit arrangement.

In an embodiment, the method further includes selecting the first biasing resistor to have a resistance equal to a resistance of the second biasing resistor, and forming the divider network with a ratio of the number P to the number M equal to a ratio of a resistance of the second voltage divider resistor to a resistance of the first voltage divider resistor.

In a further embodiment, the method includes coupling a collector-base resistor with a resistance R3 between an emitter and a base of one of the number M of at least one semiconductor device, and providing the bias current for the comparator by a current mirror coupled to the first series circuit arrangement that reduces the bias current produced by the first series circuit arrangement by a factor N. The method further includes selecting resistance values for the collector-base resistor, the first and second biasing resistors, and the first and second voltage divider resistors to substantially satisfy the relationship $$\left[ \frac{P \cdot R1 - M \cdot R2}{R1 + R2} + (R4 - R5) \cdot \frac{1}{N \cdot R3} \right] = 0$$

wherein R1 and R2 represent, respectively, resistances of the first and the second voltage divider resistors, and wherein R4 and R5 represent, respectively, resistances of the first and the second biasing resistors.

In an embodiment, the method further includes employing an output of the comparator to produce an undervoltage detection signal. In an embodiment, the method further includes coupling a first inverter to the output of the comparator to produce the undervoltage detection signal. In a further embodiment, the method includes coupling a second inverter to the output of the first inverter to produce the undervoltage detection signal.

Although processes to construct an undervoltage detector for an integrated circuit and related methods have been described for application to a control chip for a power converter, it should be understood that other applications of these processes such as for other applications of an integrated circuit formed with an input bias voltage undervoltage detector are contemplated within the broad scope of the invention, and need not be limited to power converter applications employing processes introduced herein.

Although the disclosure has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. An undervoltage detector, comprising:
    a voltage divider network comprising:
        a first circuit coupled to a first terminal of an input bias voltage source, the first circuit including a number M of semiconductor devices, wherein M is at least one,
        a second circuit coupled in series with the first circuit, the second circuit including a first voltage divider resistor, a second voltage divider resistor, and a circuit node between the first voltage divider resistor and the second voltage divider resistor, and
        a third circuit in series with the second circuit and coupled to a second terminal of the input bias voltage source, the third circuit including a number P of semiconductor devices, wherein P is at least one, wherein a ratio of the number P to the number M is equal to a ratio of a resistance of the second voltage divider resistor to a resistance of the first voltage divider resistor;
    a comparator having a first input coupled to the circuit node and a second input coupled to a voltage reference; and
    a current mirror configured to receive a first current from the first circuit, the current mirror configured to provide a bias current to the comparator.

2. The undervoltage detector as claimed in claim 1, further comprising:
    a first biasing resistor coupled to a current input terminal of a first comparator input transistor; and
    a second biasing resistor coupled to a current input terminal of a second comparator input transistor.

3. The undervoltage detector as claimed in claim 2,
    wherein the first comparator input transistor comprises a metal oxide semiconductor field-effect transistor (MOSFET),
    wherein the current input terminal of the first comparator input transistor comprises a source input terminal of the first comparator input transistor,
    wherein the second comparator input transistor comprises a MOSFET, and
    wherein the current input terminal of the second comparator input transistor comprises a source input terminal of the second comparator input transistor.

4. The undervoltage detector as claimed in claim 2, wherein at least one of the P semiconductor devices and at least one of the M semiconductor devices are coupled in a diode configuration.

5. The undervoltage detector as claimed in claim 1,
    wherein a resistance of the first biasing resistor is substantially equal to a resistance of the second biasing resistor, and
    wherein a ratio of the number P to the number M is equal to a ratio of a resistance of the second voltage divider resistor to a resistance of the first voltage divider resistor.

6. The undervoltage detector as claimed in claim 1, further comprising a collector-base resistor with a resistance R3 coupled between an emitter and a base of one of the number M of semiconductor devices,
    wherein the bias current provided by the first circuit for the comparator is coupled to the comparator by a current mirror that reduces the bias current by a factor N,
    wherein R1 and R2 represent, respectively, resistances of the first and the second voltage divider resistors,
    wherein R4 and R5 represent, respectively, resistances of the first and the second biasing resistors, and wherein the relationship $$\left[\frac{P \cdot R1 - M \cdot R2}{R1 + R2} + (R4 - R5) \cdot \frac{1}{N \cdot R3}\right] = 0$$

is substantially satisfied.

7. The undervoltage detector as claimed in claim 1, wherein an output of the comparator produces an undervoltage detection signal.

8. The undervoltage detector as claimed in claim 7, further comprising an inverter coupled to the output of the comparator to produce the undervoltage detection signal.

9. A method of forming an undervoltage detector, comprising:
    forming a voltage divider network comprising:
        coupling a first series circuit arrangement of a number M of at least one semiconductor device to a first terminal of an input bias voltage source,
        coupling a second series circuit arrangement of a first voltage divider resistor and a second voltage divider resistor in series with the first series circuit arrangement, wherein a circuit node is formed between the first and the second voltage divider resistors,
        coupling a third series circuit arrangement of a number P of at least one semiconductor device to a second terminal of the input bias voltage source, wherein the third series circuit arrangement is coupled in series with the second series circuit arrangement; and
    forming a comparator, including
        coupling one input thereof to the circuit node formed between the two voltage divider resistors, and
        coupling another input thereof to a voltage reference; and
    coupling to the first series circuit arrangement a first current mirror, the first series circuit arrangement providing a first current to the first current mirror, the first current mirror providing a bias current for the comparator.

10. The method as recited in claim 9 further comprising:
    coupling a first biasing resistor to a source terminal of a first comparator input transistor; and
    coupling a second biasing resistor to a source terminal of a second comparator input transistor.

11. The method as recited in claim 9 further comprising:
    coupling a collector-base resistor with a resistance R3 between an emitter and a base of one of the number M of at least one semiconductor device;
    wherein the current mirror reduces the bias current produced by the first series circuit arrangement by a factor N; and
    wherein resistance values of the collector-base resistor, the first and second biasing resistors, and the first and second voltage divider resistors to substantially are configured to satisfy the relationship $$\left[\frac{P \cdot R1 - M \cdot R2}{R1 + R2} + (R4 - R5) \cdot \frac{1}{N \cdot R3}\right] = 0$$

where R1 and R2 represent, respectively, resistances of the first and the second voltage divider resistors, and
where R4 and R5 represent, respectively, resistances of the first and the second biasing resistors.

12. A method of detecting an undervoltage condition comprising:
- receiving an input bias voltage;
- generating a scaled voltage by applying the input bias voltage to a voltage divider network, the voltage divider network including:
  - a first circuit having a number M of semiconductor devices, wherein M is at least one,
  - a second circuit coupled in series with the first circuit, the second circuit including a first voltage divider resistor, a second voltage divider resistor, and a circuit node between the first voltage divider resistor and the second voltage divider resistor, and
  - a third circuit coupled in series with the first and second circuits, the third circuit having a number P of semiconductor devices, wherein P is at least one;
- outputting the scaled voltage from the voltage divider network to a comparator;
- driving a first node of a first current mirror with a first current from the first circuit;
- scaling the first current by a factor of N using the first current mirror to generate a scaled current;
- driving the scaled current to a node of a second current mirror and generating a bias current for the comparator from a second node of the second current mirror;
- comparing the scaled voltage to a reference voltage in the comparator; and
- outputting an undervoltage condition signal from the comparator when the scaled voltage falls below a predetermined threshold, wherein the ratio of M to P is configured to be equal to the ratio of the first voltage divider resistor and the second voltage divider resistor.

13. The method as recited in claim 12 further comprising:
- coupling a first biasing resistor to a source terminal of a first comparator input transistor;
- coupling a second biasing resistor to a source terminal of a second comparator input transistor; and
- wherein the first biasing resistor is configured to have a resistance equal to a resistance of the second biasing resistor.

14. The method of detecting an undervoltage condition of claim 12 wherein the step of comparing the scaled voltage to a reference voltage in the comparator further comprises:
- receiving the scaled voltage in at first input of the comparator;
- receiving a reference voltage at a second input of the comparator;
- receiving the bias current at a current input of the comparator; and
- generating undervoltage condition signal when the scaled voltage is less than the reference voltage.

15. The undervoltage detector of claim 1, wherein M is at least 2 and P is at least 2.

16. The method as recited in claim 9, wherein the first series circuit arrangement providing the first current to the first current mirror, the current mirror that provides the providing the bias current for the comparator further comprises:
- coupling a first node of the first current mirror with the first current from the first series circuit arrangement; and
- coupling a second current mirror to an output of the first current mirror, the second current mirror providing the bias current for the comparator.

17. The method as recited in claim 9, wherein the number M is at least 2 semiconductor devices, and wherein the number P is at least 2 semiconductor devices.

* * * * *